United States Patent
Kassner

(10) Patent No.: US 7,753,165 B2
(45) Date of Patent: Jul. 13, 2010

(54) DEVICE AND METHOD FOR ACTIVE NOISE CANCELLATION IN EXHAUST GAS CHANNEL OF A COMBUSTION ENGINE

(75) Inventor: Uwe Kassner, Moeglingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/313,209

(22) Filed: Nov. 17, 2008

(65) Prior Publication Data

US 2009/0173568 A1    Jul. 9, 2009

(51) Int. Cl.
F01N 1/06 (2006.01)
F02M 35/10 (2006.01)
G01L 23/22 (2006.01)
G06F 11/30 (2006.01)
G10K 11/16 (2006.01)

(52) U.S. Cl. .............. 181/206; 73/114.07; 123/184.53; 381/71.7; 381/71.11; 702/183

(58) Field of Classification Search ............. 181/206; 702/183; 73/114.07; 123/184.53; 381/71.1, 381/71.7, 71.11
See application file for complete search history.

(56) References Cited

U.S. PATENT DOCUMENTS

| | | | | |
|---|---|---|---|---|
| 4,445,389 A | * | 5/1984 | Potzick et al. | 73/861.27 |
| 4,520,320 A | * | 5/1985 | Potzick et al. | 327/7 |
| 5,325,438 A | * | 6/1994 | Browning et al. | 381/71.7 |
| 5,571,239 A | * | 11/1996 | Kameda et al. | 123/184.53 |
| 2008/0095383 A1 | * | 4/2008 | Pan et al. | 381/71.11 |
| 2008/0133177 A1 | * | 6/2008 | Klenk et al. | 702/183 |
| 2009/0220102 A1 | * | 9/2009 | Pan et al. | 381/71.11 |

FOREIGN PATENT DOCUMENTS

| | | |
|---|---|---|
| DE | 195 43 409 | 6/1996 |
| DE | 198 61 018 | 6/2000 |
| EP | 0 481 450 | 4/1992 |
| EP | 0 840 285 | 5/1998 |

* cited by examiner

*Primary Examiner*—Jeffrey Donels
*Assistant Examiner*—Christina Russell
(74) *Attorney, Agent, or Firm*—Kenyon & Kenyon LLP

(57) ABSTRACT

In a method and a device for canceling the noise in an exhaust gas channel of a vehicle, a noise signal is received from the exhaust gas channel using a sound sensor, and a frequency signal which has the same amplitude and the opposite phase as the noise signal is generated. The generated frequency signal is acoustically mixed with the noise signal in the exhaust gas channel using a sound converter, there by reducing the noise in the exhaust gas channel. In addition, the temperature in the exhaust gas channel is calculated based on the received sound signal.

9 Claims, 2 Drawing Sheets

DEVICE AND METHOD FOR ACTIVE NOISE CANCELLATION IN EXHAUST GAS CHANNEL OF A COMBUSTION ENGINE

BACKGROUND OF THE INVENTION

1. Field of the Invention

The present invention relates to a device and a method for active noise cancellation in exhaust gas channel of a combustion engine.

2. Description of Related Art

The published European patent document EP 0 840 285 already discusses a device for noise cancellation, with means to receive a sound signal from the exhaust gas channel, means to generate an anti noise signal, which, when acoustically coupled to the sound from exhaust gas channel, the result will be cancellation of both signals, resulting in reduction in noise.

BRIEF SUMMARY OF THE INVENTION

The present invention provides the following advantages:

The present invention, which provides noise reduction in the exhaust gas channel of a combustion engine, additionally provides the ability to compute the temperature in the exhaust gas channel without a temperature sensor, and/or the ability to diagnose the present exhaust gas temperature sensors (if they are used).

Elimination of temperature sensors in the exhaust gas channel will result in reduced hardware. Reduction in hardware will directly result in savings in the cost. In addition, the absence of temperature sensors will eliminate: the requirements of wiring the temperature sensors to the electronic control unit using cables; periodic maintenance of the sensors in terms of calibrations; maintenance of the cables; replacements of hardware components when they are faulty, etc. If the calculated temperature is used to diagnose the signal of a given temperature sensor, then an easy method of diagnosis is made available which does not require a hardware element. Furthermore, the calculated temperature can be used in the case of a failure of the normal temperature sensor. In this manner, the overall system reliability is enhanced.

In accordance with an example embodiment of the present invention, the estimation of the temperature is done only by using the feedback values from the sound sensors and the stored data records.

The major frequency component of the noise in the exhaust gas channel is estimated based on the engine speed. This involves a simple and efficient computation.

The harmonics for the anti-noise signal are generated based on the base frequency, which will further influence the noise in the exhaust gas channel.

As the pre-stored data records are used to compute the dynamic part of the noise compensation, the control logic may be configured in a simple and efficient manner.

The relationship between the feedback signal and the temperature in the exhaust gas is available as pre-stored data, thereby simplifying the computations at run time.

Since the pre-stored data records may be created off-line during application phase of the engine, a large and accurate database can be stored.

DETAILED DESCRIPTION OF THE INVENTION

Figure 1:
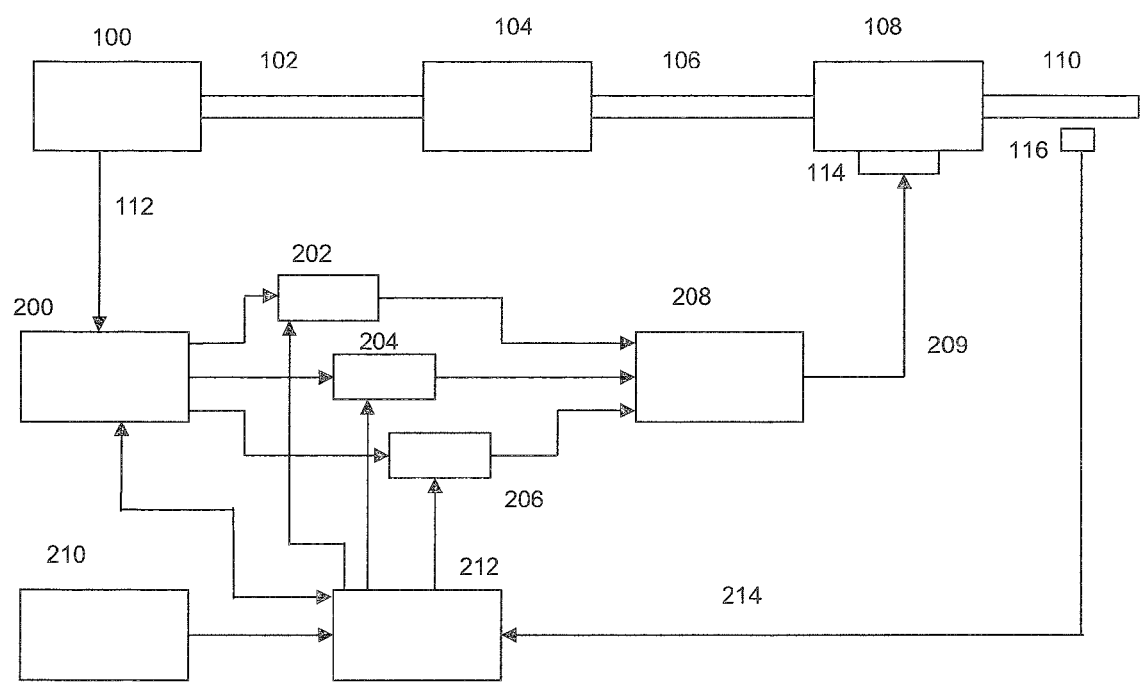
FIG. 1 shows an example embodiment of the present invention including a combustion engine, the exhaust gas channels, mufflers or catalytic converters, signal generator, digital filters, amplifier, calculation means, data records, sound converter and a sound sensing device.

FIG. 1 shows a combustion engine 100 which is connected to an exhaust gas channel 102, 106 and 110. The exhaust gas channel includes an central muffler 104 and rear muffler 108. The combustion engine is connected over line 112 to the signal generator 200. The output of signal generator is connected to three digital filters 202, 204 and 206. The digital filters also receive inputs from the calculation means 212. The calculation means 212 refers to the data records 210 in order to control the filters. The outputs of the digital filters are given to an amplifier 208. The amplifier output is given to the sound converter 114 which is in close contact with the exhaust gas channel. The exhaust gas channel has a sound sensor 116 placed in it, and output of sound sensor is connected to calculation means 212.

The combustion engine 100 mixes fuel and air in a cylinder, which is ignited, resulting in kinetic energy to move the vehicle. The residual from the combustion engine passes through the exhaust gas channel 102, 106 and 110. The exhaust gases cause noise in the exhaust gas channel. To some extent the mufflers 104 and 108 help in reducing the noise generated by the exhaust gases, but the additional noise reduction is done by the anti-noise (or noise-cancellation) device.

The anti-noise (or noise-cancellation) device typically operates by creating an anti-noise signal which has same frequency as noise signal, is equal in amplitude and opposite in phase with noise signal which needs to be reduced. When the noise signal and the anti-noise signal are acoustically combined, the two signals effectively cancel one another, significantly reducing the final sound, emitted into the surroundings of the exhaust.

The sound signal generated to reduce the noise signal may be configured to provide a particular sound design in the surroundings.

The present invention provides a device which will reduce the noise in the exhaust gas channel of the combustion engine. This device will also perform the additional functionality of computing the temperature of the exhaust gases, thus eliminating the need to have dedicated temperature sensors in the exhaust gas channel, or alternatively, provide a method to control the proper function of an existing temperature sensor (if it is present).

FIG. 1 shows the electronic device used for noise cancellation, which includes a signal generator 200, digital filters 202, 204, 206, amplifier 208, calculation means 212 and the data records 210.

The signal generator 200 receives the initial parameters, e.g., engine speed, engine load, and ignition cycle, etc., from the combustion engine 100 over the connection 112. The major frequency component of the noise in the exhaust gas channel will be directly dependant on the engine speed because the noise in the exhaust channel is generated when the exhaust gases rush into the exhaust gas channel. The frequency of the exhaust gases rushing into exhaust gas channel is dependant on the revolutions of the crankshaft, number of cylinders and number of strokes used in the cylinders of the combustion engine.

At 1000 RPM of the crankshaft, the frequency of the gases rushing through the exhaust may be estimated as below:

1000 RPM=1000/60 revolutions per second~16 revolutions per second

For 4 stroke engine, 2 revolutions will generate one burst of exhaust, and 16 revolutions per second will generate 8 bursts of exhaust. For a 4 cylinder engine, number of bursts will be 4 times, so frequency=8*4=32 Hz.

The major component of the noise in the exhaust gas channel consists of the base frequency shown in the example above. However, the noise signal will also have noticeable energy in the harmonics of the base frequency.

The amplitude of the noise signal is dependant on the load of the engine. Based on the initial parameters, the calculation means 212 computes the base frequency of the noise generated in the exhaust gas channel. The signal generator 200 generates the estimated base frequency and its harmonics and feeds them to the digital filters 202, 204, 206. The filters are used to control the individual frequencies, their amplitudes and the phase differences needed. The filter parameters are controlled by the calculation means 212 to generate the signals with appropriate amplitude and phase differences to reduce the noise in the exhaust gas channel. The output from the digital filters is given to an amplifier 208. The output of the amplifier is used to drive a sound converter 114 like loud speaker, which is placed in the exhaust gas channel. The outlet of the speaker enclosure and exhaust gas channel are positioned such that the acoustic coupling between the exhaust gas noise and the anti-noise signal results in a significant reduction of the total exhaust noise level.

The static part of the noise reduction is done by estimating the base frequency using the engine speed and engine load parameters. Any correction required for the static part of the noise reduction is available in the pre-stored data records. These data records are stored during the application phase of the engine test, during which the engine is tested under different conditions and the needed parameters are stored in the data records. The base frequency and its harmonics are generated with appropriate amplitude and phase and through the filters, amplifier and sound converter, the anti-noise signal is finally mixed with the noise in the exhaust channel to reduce the noise.

The dynamic part of the noise reduction is done using the feedback loop from the sound sensor.

Any residual noise which remains in the exhaust gas channel 110 is received by a sound sensor 116. The sound sensor may be a microphone or any similar transducer. The sound sensor produces exhaust noise feedback signal which is transmitted back to the calculation means 212. The exhaust noise feedback signal represents residual error between the exhaust noise and the anti-noise signal.

The calculation means 212 and the signal generator 200 will use the feedback signal along with the pre stored data records to fine-tune the parameters of the digital filters so that the resulting sound in the exhaust gas channel is at a minimum level for the given conditions or for sound design.

The same device reducing the noise in exhaust gas channel has the capability to compute the temperature of the exhaust gas in the exhaust gas channel based on the feedback signal and pre-stored data records.

For the determination of pre-stored data, a test engine is used. Beside fabrication tolerances, the test engine will have similar characteristics as that of the actual engine in the vehicle.

During the test phase, a temperature sensor is used to determine a connection between anti-noise signal, feedback signal (or strength of residual noise) and temperature of exhaust gas.

A table of data records is prepared, which table contains the information about frequency and phase of the anti-noise signal, phase of the feed back signal and the temperature of the exhaust gas read using a temperature sensor.

In the actual engine running in a vehicle, when the feedback signal is received from the sound sensor 116, the calculation means references the data records to compute the temperature of the exhaust gas based on the feed back signal.

The device is housed in a casing with input connection 112 for connection with engine, input connection 214 from sound sensor and an output connection 209 for sound converter, and other required wiring for power supply.

Although the digital filters are shown in the example embodiment of FIG. 1 as separate elements, the digital filters can also be built into the signal generator.

Figure 2:
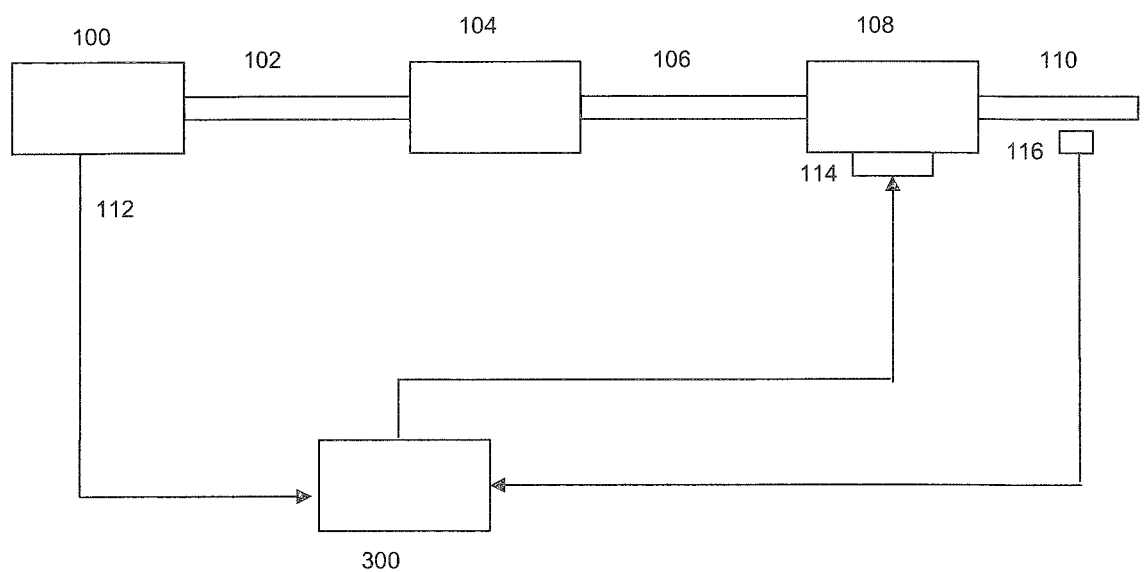
FIG. 2 shows another example embodiment of the present invention including a combustion engine, the exhaust gas channels, mufflers or catalytic converters, engine control unit which is used for all the engine control operations, sound converter and a sound sensing device.

FIG. 2 shows another example embodiment of the present invention. Here 100, 102, 104, 106, 108, 110, 112 and 114 are same elements as those shown in FIG. 1 and have the same functionality. The electronic device used for noise cancellation is integrated into the existing engine control unit 300.

The electronic control unit 300 performs the complete control and monitoring of the vehicle engine. The functionality of noise-cancellation is made part of the engine control unit 300 by integrating the signal generator, filters, amplifier, calculation means and data records as a single unit.

What is claimed is:

1. A device for active noise cancellation in an exhaust gas channel of a combustion engine, comprising:
    a sound-receiving unit configured to receive a sound signal from the exhaust gas channel;
    a frequency-generating unit configured to generate at least a first frequency signal to influence the sound generated in the exhaust gas channel;
    a calculation unit configured to receive the sound signal and generate control signals to influence amplitude and phase of the first frequency signal, wherein the calculation unit also calculates a temperature information of an exhaust gas in the exhaust gas channel, the calculation unit being connected to a plurality of digital filters and directly connected to a signal generator; and
    a data records storage connected to the calculation unit and containing predefined parameters for the frequency signals.

2. A device as claimed in claim 1, wherein the frequency-generating unit receives a speed signal of the combustion engine and derives the first frequency signal dependant on the speed signal.

3. A device as claimed in claim 1, wherein the frequency-generating unit generates further frequencies which are harmonics of the first frequency.

4. A device as claimed in claim 1, wherein the calculation unit is configured to use pre-stored data describing a dependency among engine speed, engine load, phase of the first frequency signal and amplitude of the first frequency signal.

5. A device as claimed in claim 1, wherein the calculation unit is configured to use pre-stored data describing a dependency between the temperature of the exhaust gas channel and the sound signal from the exhaust gas channel.

6. A device as claimed in claim 1, wherein the calculation unit is configured to receive a feed-back signal from the sound-receiving unit and use the feed-back signal to derive the control signals, and wherein the control signals control the generator and a filter of the frequency-generating unit.

7. A device as claimed in claim 1, wherein the calculation unit is configured to receive a feed-back signal from the sound-receiving unit and estimate the temperature in the exhaust gas channel.

8. A device as claimed in claim 1, wherein the pre-stored data records are derived during a previous engine-testing phase in which the engine is tested under different conditions.

9. A method of operating a combustion engine, comprising:
   receiving, using a sound sensor, a sound signal from an exhaust-gas channel of the combustion engine;
   based on the received sound signal, generating control signals configured to influence amplitude and phase of a frequency signal;
   acoustically coupling the frequency signal with the sound signal generated in the exhaust gas channel to influence the sound signal generated in the exhaust gas channel; and
   calculating a temperature information of an exhaust gas based on the received sound signal and pre-stored data records.

* * * * *